(12) United States Patent
Mori et al.

(10) Patent No.: US 6,287,949 B1
(45) Date of Patent: Sep. 11, 2001

(54) MULTI-CHIP SEMICONDUCTOR CHIP MODULE

(75) Inventors: Syuji Mori, Murata-machi; Takasi Sekiba; Osamu Kudo, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/145,027

(22) Filed: Sep. 1, 1998

Related U.S. Application Data

(62) Division of application No. 08/427,111, filed on Apr. 21, 1995, now Pat. No. 5,834,843.

(30) Foreign Application Priority Data

Jun. 20, 1994 (JP) .................................................. 6-137608

(51) Int. Cl.[7] .................................................. H01L 21/44
(52) U.S. Cl. .......................... 438/612; 438/107; 438/462; 438/615
(58) Field of Search ..................................... 438/107, 109, 438/110, 112, 113, 114, 118, 124, 127, 462, 463, 612, 615, 617

(56) References Cited

U.S. PATENT DOCUMENTS

| | | | |
|---|---|---|---|
| 4,860,444 | 8/1989 | Herrell et al. | 257/714 |
| 4,990,462 | 2/1991 | Sliwa, Jr. | 437/51 |
| 5,126,286 | * 6/1992 | Chance | 438/462 |
| 5,272,113 | * 12/1993 | Quinn | 156/80 |
| 5,356,838 | * 10/1994 | Kim | 438/465 |
| 5,406,027 | 4/1995 | Matsumoto et al. | 257/787 |
| 5,600,101 | * 2/1997 | Sakai | 174/261 |
| 5,786,237 | * 7/1998 | Cockerill et al. | 438/109 |
| 5,909,052 | * 6/1999 | Ohta et al. | 257/627 |

FOREIGN PATENT DOCUMENTS 64-27420     8/1990     (JP) .

* cited by examiner

Primary Examiner—Carl Whitehead, Jr.
Assistant Examiner—Jamie L. Brophy
(74) Attorney, Agent, or Firm—Armstrong, Westerman, Hattori, McLeland & Naughton, LLP

(57) ABSTRACT

A semiconductor device including a plurality of chip units each defined by a side wall and arranged in a state such that a side wall of a chip unit abuts a corresponding side wall of an adjacent chip unit, and an interconnection structure for interconnecting a plurality of terminals of a side wall of a chip unit to corresponding terminals of a side wall of an adjacent chip unit that abuts the chip unit at the respective side walls.

7 Claims, 16 Drawing Sheets

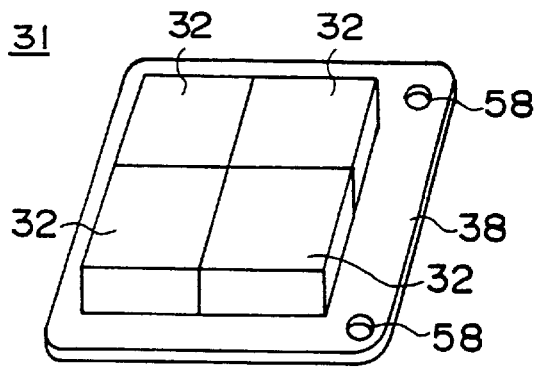
FIG. 12A
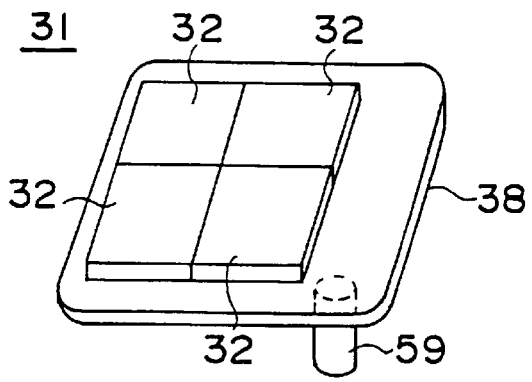
FIG. 12B
FIG. 12C
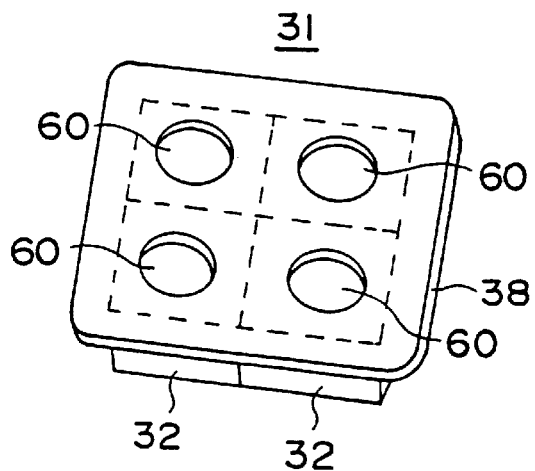

MULTI-CHIP SEMICONDUCTOR CHIP MODULE this application is a division of Ser. No. 08/427,111 filed Apr. 21, 1995, U.S. Pat. No. 5,834,843.

BACKGROUND OF THE INVENTION

1. Field of the Invention

The present invention generally relates to semiconductor devices and more particularly to a multi-chip module including a plurality of semiconductor chips.

2. Description of the Related Art

In relation to recent trend of reducing the size of various electronic apparatuses and devices while simultaneously maintaining, or even increasing, device performance, there is a stringent demand for cutting the time needed for developing new devices and a timely supply of newly developed devices to the market.

Conventionally, semiconductor devices designed for high density mounting have used the so-called QFP (quad flat package) structure that enables an increase in the number of lead pins and decrease of lead pitch.

FIG. 1 shows an example a conventional QFP device 11 mounted upon a printed circuit board 14.

Referring to FIG. 1, the QFP device 11 includes a resin package body 12 in which a semiconductor chip (not illustrated) is accommodated, wherein the QFP device 11 carries a number of lead pins 13 projecting laterally from the circumferential walls or side edges of the package body 12. The lead pins 13 are bent in the downward direction outside the package body to form a well-known gull wing structure.

The printed circuit board 14, on the other hand, is formed of a material such as glass epoxy, and carries thereon a conductor pattern 15 in correspondence to the lead wires 13 of the QFP device 11 or other components, wherein the device 11 is mounted upon the substrate 14 by soldering the lead wires 13 upon the corresponding conductor patterns 15. Such a mounting process used commonly in the art partly because of the fact that the soldering is conducts easily due to the low reflow temperature of the solder alloy and partly because of the fact that glass epoxy substrate is easily available with a low cost.

As already noted, the semiconductor device 11 includes a semiconductor chip encapsulated in the package body 12 formed of a resin, wherein the chip is held, inside the package body 12, on a lead frame stage as usual. The semiconductor chip carries bonding pads thereon, and the bonding pads are interconnected to corresponding inner leads of the lead wires 13 by bonding wires.

Meanwhile, in order to further increase the mounting density of the semiconductor devices, a so-called multi-chip module structure is proposed, wherein a plurality of semiconductor chips are encapsulated in a single package body.

FIGS. 2A–2D show the construction of a conventional multi-chip module in an elevational cross section.

Referring to FIG. 2A showing a conventional multi-chip module 21A, the multi-chip module 21A includes a chip mother board 22a carrying thereon a plurality of semiconductor chips 23, wherein the semiconductor chips 23 are connected electrically to the chip mother board 22a by means of bonding wires 24. It should be noted that the chip mother board 22a itself is held on a lead frame stage 25 and is connected electrically to inner leads 26a by the bonding wires 24. The semiconductor chips 23 are encapsulated in a resin package body 27 together with the lead frame stage 25 and the chip mother board 22a as well as with the inner leads 26a, wherein outer leads 28a extend laterally from the package body 27 as an extension of the inner leads 26a. The outer leads 28a are thereby bent in the downward direction to form a J-shaped lead structure.

FIG. 2B shows another multi-chip module 21B that includes the semiconductor chips 23 in plural numbers on a chip mother board 22b, wherein the semiconductor chips 23 are connected electrically to the chip mother board 23b by means of the lead wires 24, similarly to the device 21A of FIG. 2A. In the case of the device of FIG. 2B, on the other hand, the chip mother board 22b carries thereon inner leads 26b directly such that the inner leads 26b are held upon a lower major surface of the chip mother board 22b together with the semiconductor chips 23. The semiconductor chips 23 are thereby encapsulated in the resin package body 27 together with the chip mother board 22b and the inner leads 26b, and outer leads 28b extend laterally from the resin package body 27 as an extension of the inner leads 26b. The outer leads 28b are thereby bent in the downward direction outside the package body 27 to form a gull wing lead structure.

FIG. 2C shows a still other multi-chip module 21C, wherein the device 21C has a structure similar to that of the device 21B of FIG. 2B, except that the upper major surface of the chip mother board 22b is exposed for contact with a heat sink 29.

FIG. 2D shows a still other multi-chip module 21D, wherein the device 21D has a structure similar to that of FIG. 2B except that each of the semiconductor chips 23 carries thereon bumps 23a for mounting upon a corresponding tape lead by way of the flip-chip process. Thus, the semiconductor chips 23 are mounted upon a corresponding tape lead 30 provided on the chip mother board 22b by the flip-chip process. In the illustrated example, the semiconductor chips 23 are mounted upon both upper and lower major surfaces of the chip mother board 22b.

In the conventional single-chip device of FIG. 1 in which the printed circuit board 14 carries thereon a plurality of components including the semiconductor device 11, there has been a problem in that the size of the printed circuit board 14 tends to increase, and accordingly the length of the conductor patterns formed thereon. Thereby, the high speed operation of the electronic apparatus is substantially deteriorated. Such a single chip module further has a drawback in that one has to replace the whole printed circuit board when a failure has developed in any of the components on the board. Thereby, the cost of the electronic apparatus inevitably increases.

In the case of the multi-chip modules 21A–21D of FIGS. 2A–2D, on the other hand, it should be noted that the interconnection between the semiconductor chips 23 and the chip mother board 22a or 22b is achieved by way of the bonding wire 24 or tape lead 30. Thus, such a conventional construction has a drawback of increased length of wiring and corresponding deterioration of the operational speed. Further, construction of FIGS. 2A–2D has another drawback in that it requires extensive modification of the interconnection or replacement of components when a design change has occurred in the multi-chip module. In such conventional multi-chip modules, therefore, such a design change inevitably invites substantial increase in the number of the fabrication steps and hence a corresponding increase in the fabrication cost of the device.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a low cost semiconductor device having a high operational speed.

Another object of the present invention is to provide a semiconductor device, comprising:

a plurality of chip units each defined by a side wall and including a semiconductor chip, said plurality of chip units being arranged in a state such that a side wall of a chip unit abuts a corresponding side wall of an adjacent chip unit, each of said plurality of chip units including a plurality of terminals; and interconnection means for interconnecting said plurality of terminals of a chip unit to corresponding terminals of an adjacent chip unit that abuts said chip unit at said respective side walls.

According to the present invention, it is possible to construct a flat multi-chip module of high performance with a substantially reduced thickness. Further, such a multi-chip module allows easy replacement of the chip unit as necessary, even when there occurs a change in the design of the multi-chip module. Thereby, the fabrication cost of the semiconductor device is reduced. Further, the multi-chip module of the present invention eliminates use of interconnection wires or patterns and the operational speed of the device is maximized.

Other objects and further features of the present invention will become apparent from the following detailed description when read in conjunction with the attached drawings.

BRIEF DESCRIPTION OF THE DRAWINGS

FIGS. 12A–12C are diagrams showing the multi-chip module of the first embodiment that uses other chip mother boards;

DETAILED DESCRIPTION OF THE PREFERRED EMBODIMENTS

Figure 1:
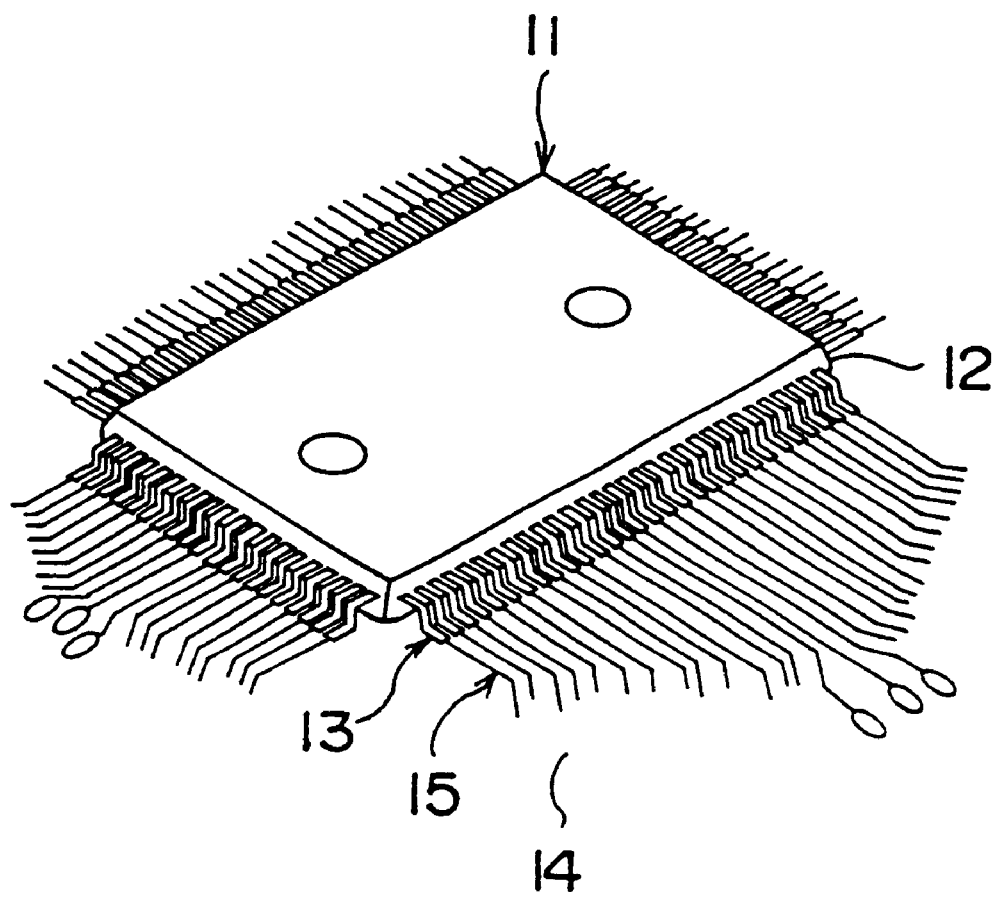
FIG. 1 is a diagram showing the construction of a conventional semiconductor device having the QFP structure.
Figure 2A:
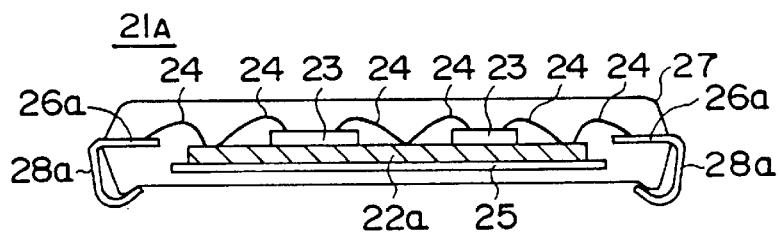
FIGS. 2A–2D are diagrams showing the structure of various conventional multi-chip modules.
Figure 2B:
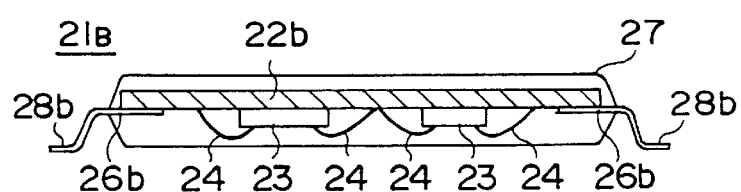
Figure 2C:
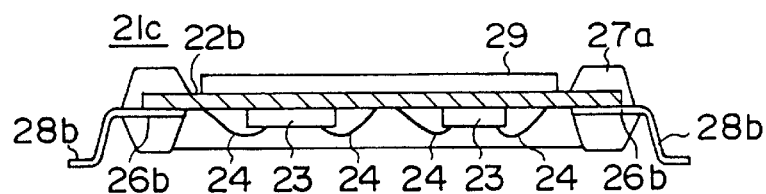
Figure 2D:
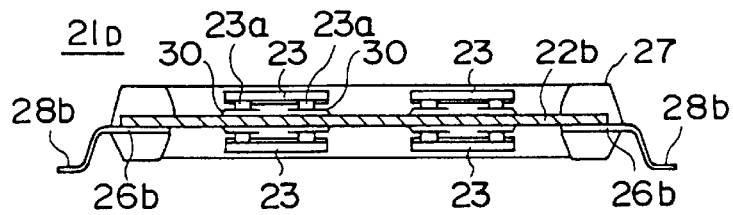
Figure 3A:
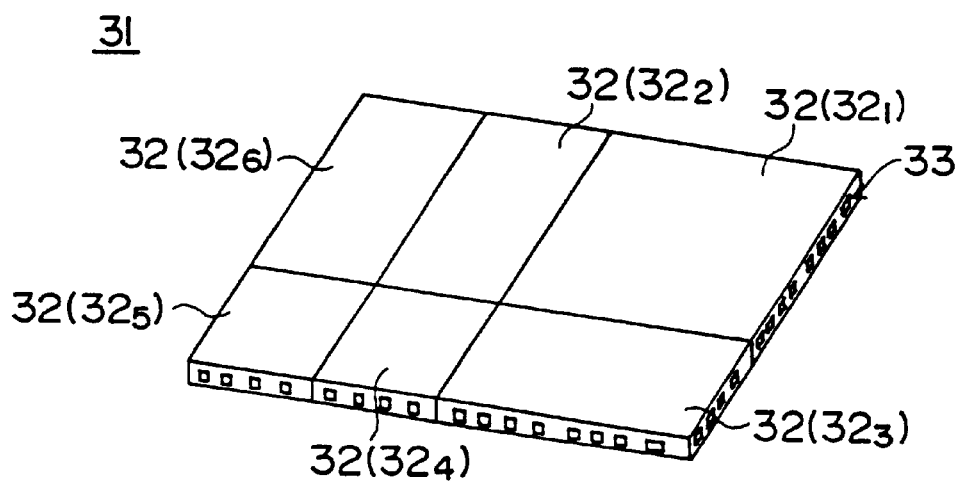
FIGS. 3A and 3B are diagrams showing the construction of a multi-chip module according to a first embodiment of the present invention respectively in a perspective view and an exploded view.
Figure 3B:
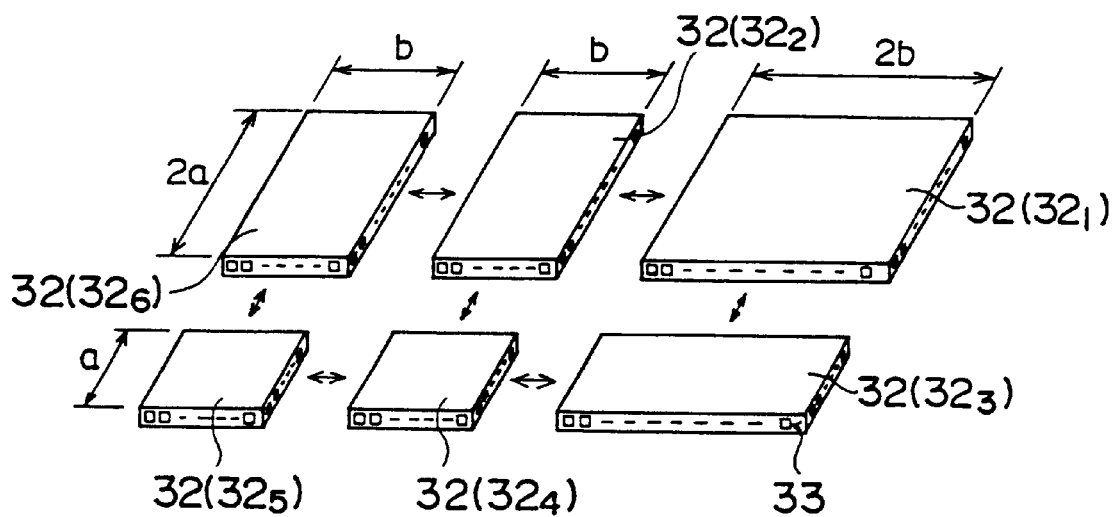

FIGS. 3A and 3B show the construction of a multi-chip module 31 according to a first embodiment of the present invention, wherein FIG. 3A shows the overall construction of the multi-chip module 31 while FIG. 3B shows the process of assembling the multi-chip module 31 of FIG. 3A.

Referring to FIG. 3A, the multi-chip module 31 includes a number of chip units 32 ($32_1$–$32_6$) each having a rectangular shape, wherein the chip units $32_1$–$32_6$ are assembled in a two-dimensional plane to form together a flat body. As can be seen in FIG. 3A, the chip units 32 are assembled such that a side edge of a chip unit, such as the chip unit $32_1$, abuts a corresponding side edge of adjacent chip unit such as the chip unit $32_2$ or $32_3$. The chip units $32_1$–$32_6$ are designed to perform various respective functions such as a memory function, arithmetic function, power supplying function, clock generation function, resistor function, capacitor function, and the like, and are formed of respective bare chips. For example, the chip unit $32_1$ may act as a memory, the chip unit $32_2$ may act as an arithmetic unit, the chip unit $32_3$ may act as a power supply, the chip unit $32_4$ may act as a clock generator, the chip unit $32_5$ may act as a resistor and the chip unit $32_6$ may act as a capacitor.

As indicated in FIG. 3A, each of the chip units $32_1$–$32_6$ carries a plurality of terminals 33 on the side edges thereof such that the terminals 33 are exposed on the side edges. In the assembled state shown in FIG. 3A wherein the chip units 32 abut with each other at respective side edges, the terminals on a chip unit such as the chip unit $32_1$ abuts respective, corresponding terminals on an adjacent chip unit such as the chip unit $32_2$. Thereby, the chip units 32 forming the multi-chip module 31 are electrically interconnected with each other.

FIG. 3B shows the multi-chip module 31 in an exploded view.

Referring to FIG. 3B, each of the chip units 32 forming the multi-chip module 31 has a rectangular shape with first and second, mutually intersecting side edges, wherein the first side edge is set to have a length of an integer multiple of a fundamental length a. Further, the second side edge is set to have a length equal to an integer multiple of another fundamental length b. Thus, the chip unit $32_5$ has a size of a×b, while the chip unit $32_1$ has a size of 2a×2b. Similarly, the chip unit $32_6$ has a size of 2a×b, while the chip unit $32_3$ has a size of a×2b.

In each of the chip units 32, it should be noted that the terminals 33 are formed by providing suitable electrode patterns on a wafer, followed by scribing along the scribe lines. As a result of scribing that divides the wafer into the individual chip units 32, the electrode patterns are exposed on the side edges of the chip units 32 as the terminals 33.

In the multi-chip module 31 of FIG. 3A, it should be noted that one can easily attend to the required design change by merely replacing one or more of the chip units 32. Thereby, the time needed for developing a new device is reduced substantially. Further, the multi-chip module 31 of FIG. 3A has an advantageous feature of increased operational speed, as the multi-chip module 31 eliminates the bonding wire or tape lead used in the conventional multi-chip modules for electrical connection.

Figure 4A:
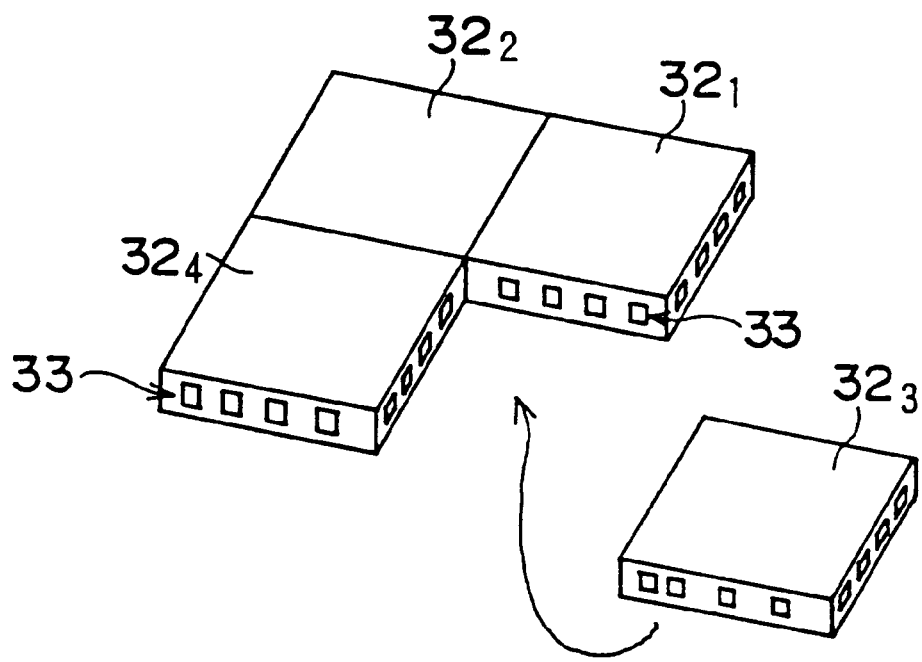
FIGS. 4A and 4B are diagrams showing the assembling process of the multi-chip module of the first embodiment of the present invention.
Figure 4B:
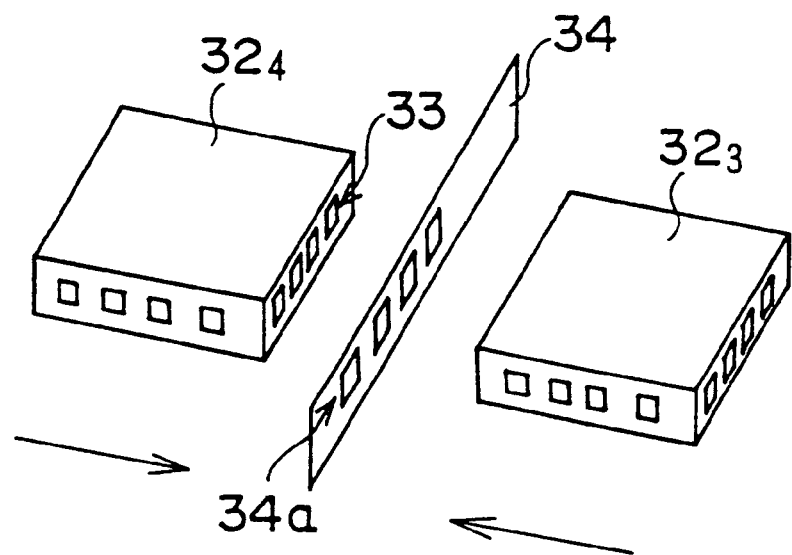

FIGS. 4A and 4B show the assembling of the multi-chip module 31 of FIG. 3A. As shown in FIG. 4A, the assembling of the multi-chip module 31 is achieved by engaging the terminals 33 on the side edge of a chip unit such as the chip unit $32_3$, with the corresponding terminals 33 provided on the respective side edges of the chip units $32_1$ and $32_4$.

FIG. 4B shows the details of the assembling process of FIG. 4A.

Referring to FIG. 4B, a sheet 34 carrying a number of conductor pads 34a thereon, is disposed between the terminals 33 of the chip unit $32_3$ and the terminals 33 of the chip unit $32_4$. Thereby, the terminals 33 of the chip unit $32_3$ are connected electrically to the corresponding terminals 33 of the chip unit $32_4$ via the conductor pads 34a. In the construction of FIG. 4B, it is not necessary that the conductor pad 34a connects only the terminals 33 that oppose with each other across the sheet 34. By providing a conductor pattern on the sheet 34, it is possible to connect a terminal 33 on the chip unit $32_3$ to a corresponding terminal 33 of the chip unit $32_4$, which terminal 33 being the one not facing directly to the foregoing terminal 33 of the chip unit $32_3$. Further, by applying adhesives upon the sheet 34, it is possible to connect the chip unit $32_3$ against the chip unit $32_4$ or $32_1$ mechanically.

Figure 5A:
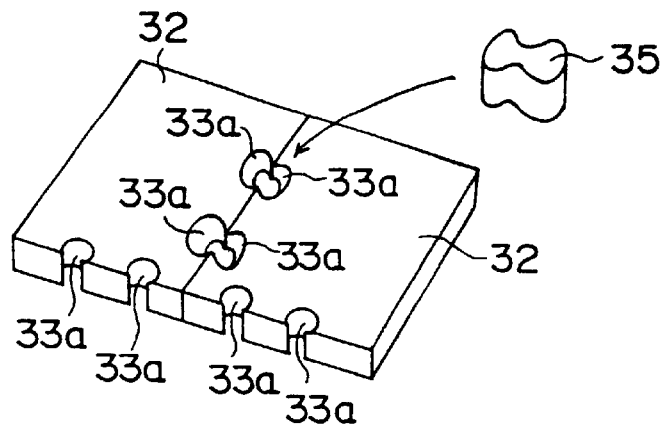
FIGS. 5A–5C are diagrams showing various modifications of the multi-chip module of the first embodiment of the present invention.
Figure 5B:
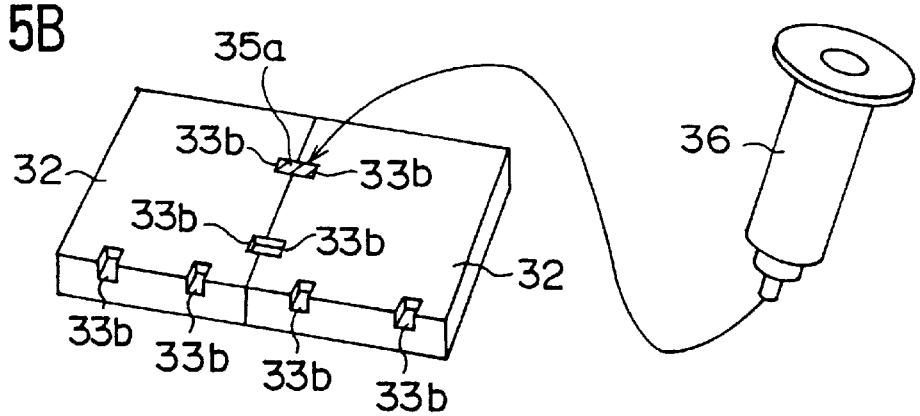
Figure 5C:
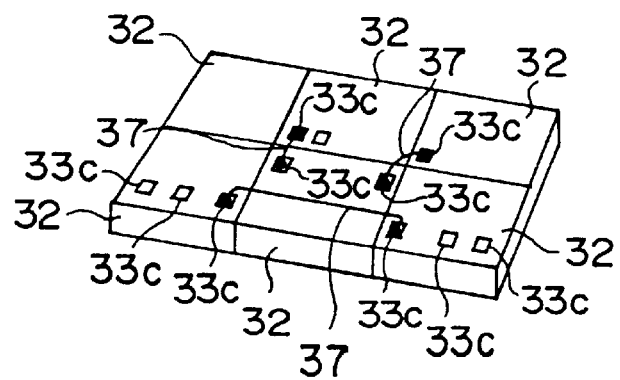

FIGS. 5A–5C show another examples of connecting the chip units 32 with each other, wherein FIG. 5A shows a case wherein each of the chip units 32 has terminals 33a on the side edges thereof such that each terminal 33a has a circular cutout or depression that increases the size in the interior of the chip unit. Thereby, two such circular cutouts form together a dumbbell shaped cutout when a chip unit 32 and another chip unit 32 are assembled with each other in the state that the respective side edges abut with each other. In the example of FIG. 5A, the dumbbell shaped cutout is filled by a corresponding dumbbell shaped conductor element 35 that achieves not only the electrical connection between the two terminals 33a but also a mechanical connection of the two adjacent chip units 32.

FIG. 5B shows an example wherein each of the chip units 32 carries a plurality of terminals 33b along the side edge of the chip unit in the form of a cutout provided at the upper corner of the foregoing side edge. Thus, the terminals 33b of the two adjacent chip units 32 form together a depression when the two chip units 32 are abutted with each other at the respective side walls. By filling the depression by a silver paste 35 as indicated in FIG. 5B, followed by curing, it is possible to provide a positive contact between the two chip units.

FIG. 5C shows a case in which terminal pads 33c are formed on the upper major surface of the chip unit 32. In the example of FIG. 5C, the chip units 32 are assembled to form a flat body similarly as before, wherein the terminal pads 33c on the upper major surface of the chip units are connected with each other by bonding wires 37. By using the bonding wire 37, it becomes also possible to connect the chip units 32 that do not contact with each other, although such a wire bonding provides a slight delay in signal processing due to the increased length of the bonding wire. Even so, the construction of the present invention provides a much higher processing speed as compared with the conventional multi-chip module shown in FIGS. 2A–2D. Of course, it is possible to use a tape lead in place of the bonding wire 37.

In any of the embodiments described above, the terminals such as the terminals 33, 33a, 33b or 33c, are connected to external conductor patterns on the printed circuit board either directly or via suitable socket means.

Figure 6A:
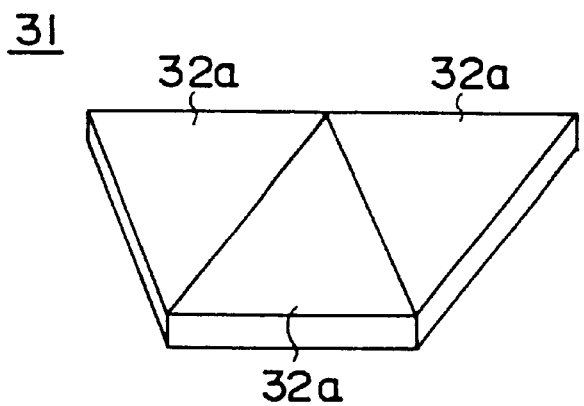
FIGS. 6A–6C are diagrams showing further modifications of the first embodiment.
Figure 6B:
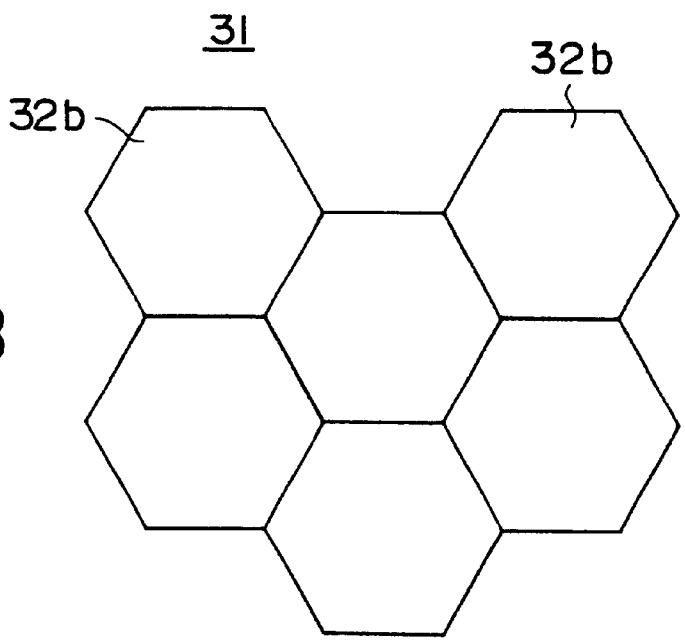
Figure 6C:
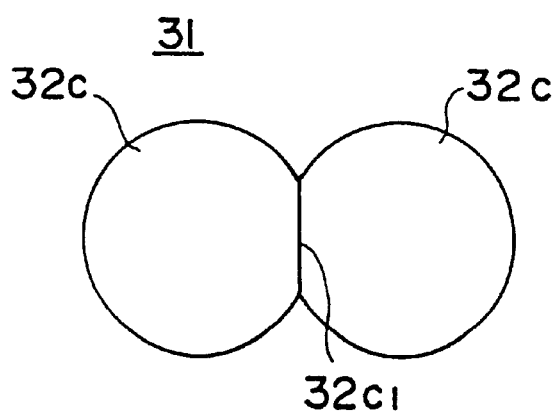

FIGS. 6A–6C show other examples of the chip unit of the present invention.

Referring to FIG. 6A, showing the multi-chip module 31 formed of chip units 32a, it will be noted that the chip units 32a has a triangular shape and reduces the size of the multi-chip module 31 over the multi-chip module that uses the chip unit 32, depending on the number of the chip units used. It should be noted that such triangular chip units 32a can be formed easily by conventional wafer processing technology.

FIG. 6B shows a case wherein the multi-chip module 31 is formed of hexagonal chip units 32b. By using such hexagonal chip units 32b, it is possible to increase the area of contact with adjacent chip units, and the interconnection with other chip units is facilitated.

Further, the shape of the chip unit is not limited to triangular or hexagonal as set forth above, but other shapes such as octagonal shape is also possible. On the other hand, the size of the edge has to be set to be an integer multiple of a predetermined size.

FIG. 6C shows a case in which the multi-chip module 31 is formed of circular chip units 32c, wherein each of the circular chip units 32c has a flat edge $32c_1$ similar to the one provided on a semiconductor wafer, wherein two such circular chip units 32c are contacted with each other at the flat edge $32c_1$.

Next, the process of mounting the chip units 32 upon a chip mother board will be described with reference to FIGS. 7A–7C.

Figure 7A:
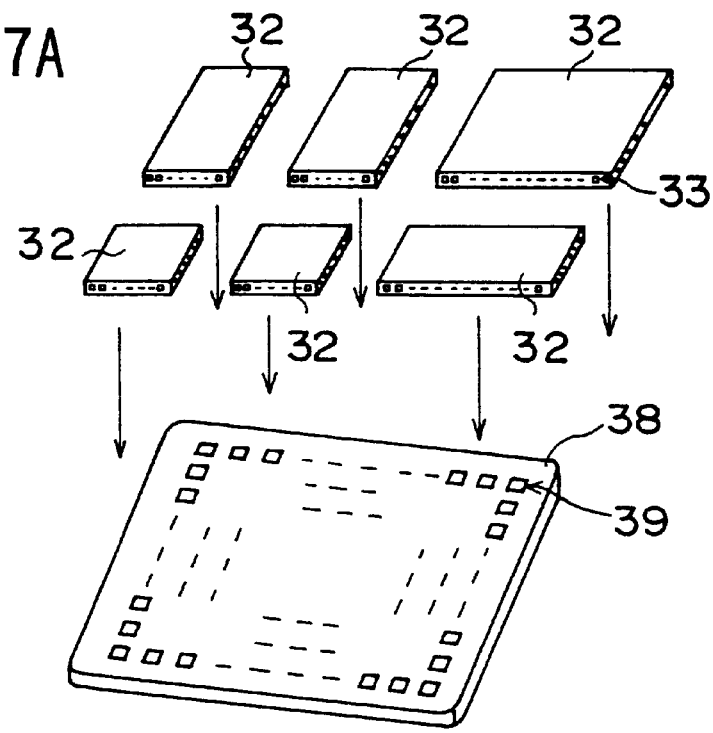
FIGS. 7A–7C are diagrams showing the assembling of the multi-chip module of the first embodiment.

Referring to FIG. 7A, the chip units 32 each carrying the terminals 33 on the side edges thereof are mounted upon a chip mother board 38 that carries thereon interconnection pads 39 that act also as a point of mechanical connection, wherein the pads 39 are formed with number and pitch corresponding to the number and pitch of the terminals 33 on the chip units 32 as well as the terminals for external connection. The interconnection of the terminals 33 on the chip units 32 and the pads 39 on the chip mother board 38 is achieved by applying a laser beam to the contacting part of the terminal 33 and the pad 39 to cause a reflowing. Alternatively, one may achieve the electrical contact by using solder alloys or conductive resins such as silver paste. Such a construction is advantageous in the point that the chip units 32 can be easily dismounted by heating or by applying a laser beam whenever there arises a need for replacing the chip unit 32. As a result, one obtains a flat structure for the multi-chip module 31 as indicated in FIG. 7B.

Figure 7B:
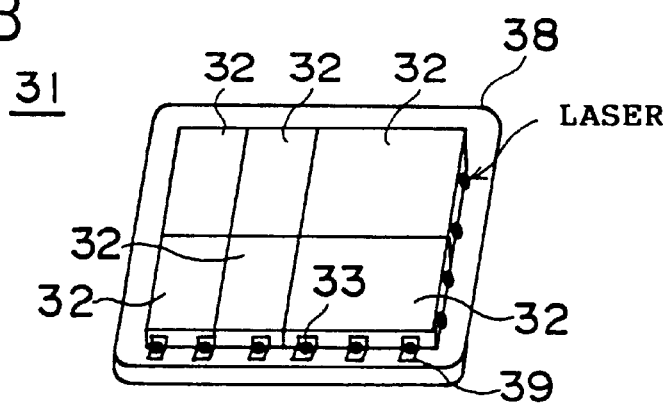
Figure 7C:
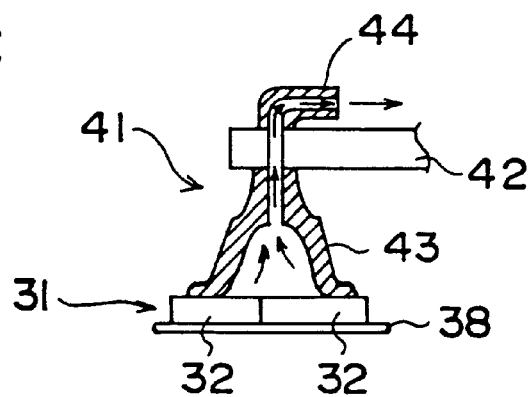

It should be noted that such a flat multi-chip module 31 is suitable for handling by an automatic transport system as indicated in FIG. 7C.

Referring to FIG. 7C, the automatic transport system includes a suction unit 41 on a tip end of an arm 42, wherein the suction unit 41 includes a suction pad 43 that is evacuated via a tube 44. Thereby, the suction pad 43 engages firmly upon the upper major surface of the flat multi-chip module 31 and carries the same as necessary.

It should be noted that the external connection of the multi-chip module 31 is achieved as necessary by suitable means such as a connector or wire. For example, one may provide a pad on a rear surface the chip mother board 38 in electrical connection to the pad 39 to form a BGA (ball grid array) structure.

Figure 8A:
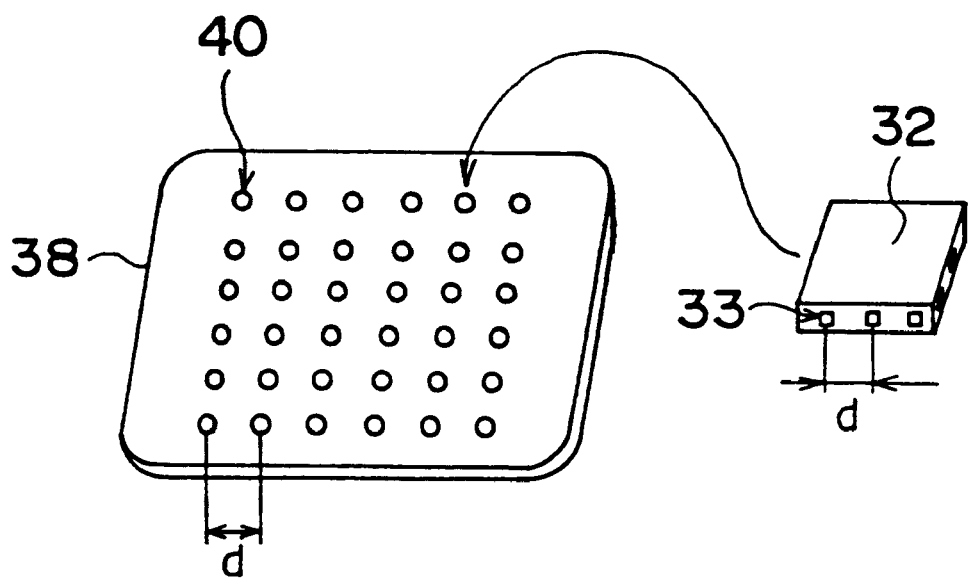
FIGS. 8A and 8B are diagrams showing another example of assembling the multi-chip module of the first embodiment.
Figure 8B:
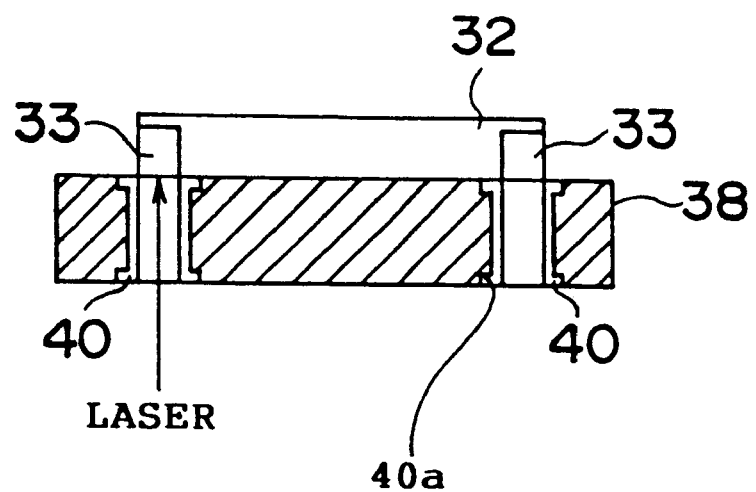

FIGS. 8A and 8B show another example of mounting the chip units 32 upon the chip mother board 38.

Referring to FIG. 8A, the chip mother board 38 is formed with a number of through holes 40 along the edge of the chip assembly, which chip assembly being formed of the chip units 32 arranged side by side, with a pitch d corresponding to the pitch of the terminals 33 on the side wall of the chip assembly. As indicated in FIG. 8B, each chip 32 carries the terminals 33 along the lower edge of the side walls such that each terminal 33 contacts with a conductive sleeve 40a provided in the corresponding through hole 40. By applying a laser beam, the terminals 33 cause a fusion and establishes a firm mechanical as well as electrical contact with the sleeves 40a of the through holes 40.

FIGS. 9A–9D show the case of mounting the chip units 32 generally vertically upon the chip mother board 38.

Figure 9A:
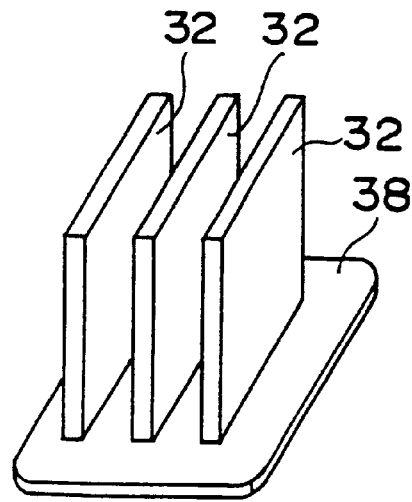
FIGS. 9A–9D are diagrams showing other various modifications of the multi-chip module of the first embodiment.

Referring to FIG. 9A, each of the chip units 32 is mounted upon the chip mother board 38 substantially vertically such that an edge of the chip unit 32 abuts with the chip mother board 38. According to the construction of FIG. 9A, it is possible to reduce the area of the multi-chip module 31 when viewed in the direction perpendicular to the chip mother board 38. Further, such a structure is advantageous for enhancing the cooling efficiency. In the structure of FIG. 9A, it should be noted that the area of contact of the chip units 32 and the chip mother board 38 is substantially reduced, and the heat transfer from the chip units 32 to the mother board 38 is accordingly reduced.

Figure 9B:
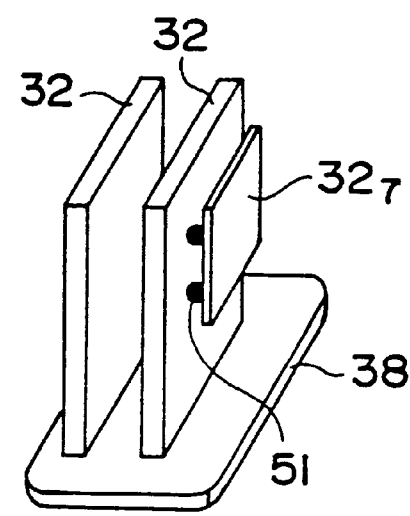

FIG. 9B, on the other hand, shows a modification of FIG. 9A, wherein another chip unit $32_7$ is mounted upon the chip unit $32_2$ by way of solder bumps 51. Such a construction is useful for example is a memory unit for increasing the memory capacity by adding extra memory unit by way of the chip unit $32_7$.

Figure 9C:
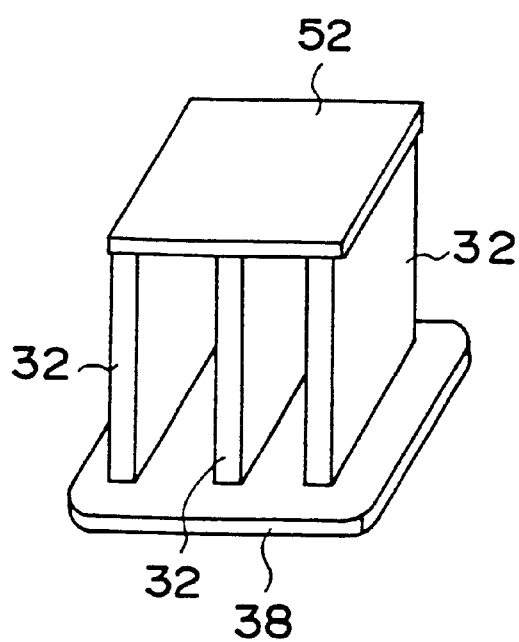

FIG. 9C shows a modification of FIG. 9A wherein another chip unit 52 is provided so as to bridge across the memory units 32 that are held vertically on the chip mother board 38. In such a structure, the chip unit 52 abuts the exposed side edges of the chip units 32, and it is possible to achieve electrical connection between various of the chip units 32 on the chip mother board 38. In the construction of FIG. 9C, it should be noted that the chip unit 52 can be provided also on other side edges of the chip units 32.

Figure 9D:
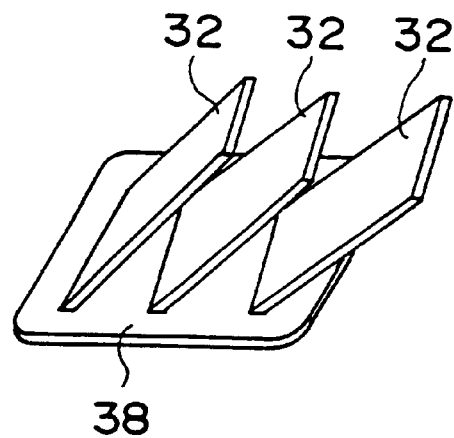

FIG. 9D shows a modification of FIG. 9A wherein the chip units 32 are provided on the chip mother board 38 obliquely. According to the construction of FIG. 9D, it is possible to reduce the height of the multi-chip module 31.

FIGS. 10A–10D show the cooling of the multi-chip module 31 of the present invention.

Figure 10A:
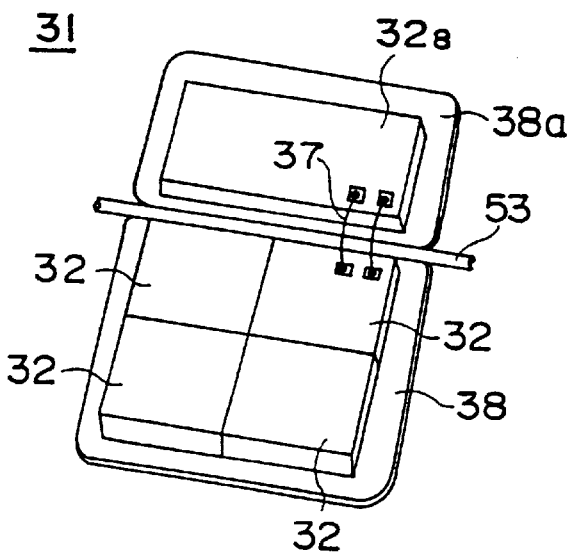
FIGS. 10A–10D are diagrams showing various cooling schemes of the multi-chip module of the first embodiment.

Referring to FIG. 10A, the multi-chip module 31 carries four chip units 32 on the chip mother board 38 to form a flat arrangement, wherein there is provided another chip mother board 38a that carries thereon another chip unit $32_8$. In the construction of FIG. 10A, the chip unit $32_8$ and the chip unit 32 are connected with each other by bonding wires 37, wherein it will be noted that there is disposed a cooling pipe 53 between the chip mother board 38 and the chip mother board 38a for cooling the same by the air or a fluid passing through the cooling pipe 53. Such a construction is particularly useful for isolating the chip mother board 38 from the other chip mother board 38a thermally or vice versa, such that the heating in one of the chip mother boards does not cause influence in the other chip mother board. Further, by using two chip mother boards 38 and 38a rather than using a single chip mother board, it is possible to enhance the effect of cooling even when the cooling by means of the cooling pipe 53 is not employed.

Figure 10B:
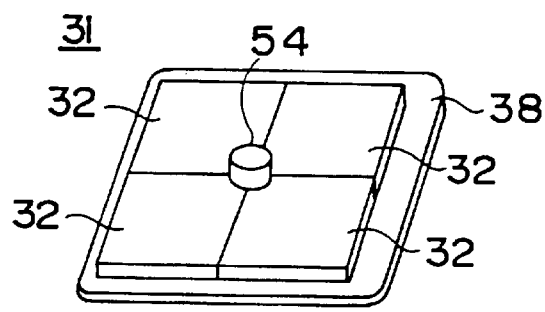

FIG. 10B shows a construction in which a heat radiation element 54 is provided at a suitable location of the multi-chip module 31 in which a plurality of chip units 32 are assembled on the chip mother board 38 to form a flat structure. In the example of FIG. 10B, it should be noted that the chip units 32 are formed to as to expose the region of the chip mother board 38 on which the heat radiation element 54 is provided. By using the heat radiation element 54, it is possible to enhance the efficiency of heat dissipation of the multi-chip module 31.

Figure 10C:
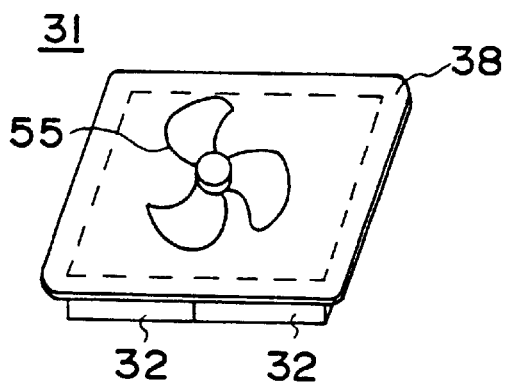

FIG. 10C shows a structure wherein a cooling fan 55 is provided on the rear side of the chip mother board 38. The cooling fan 55 may be the one that moves freely with the cooling air, or the one that includes a drive motor. In any of these examples, the efficiency of cooling is further enhanced.

Figure 10D:
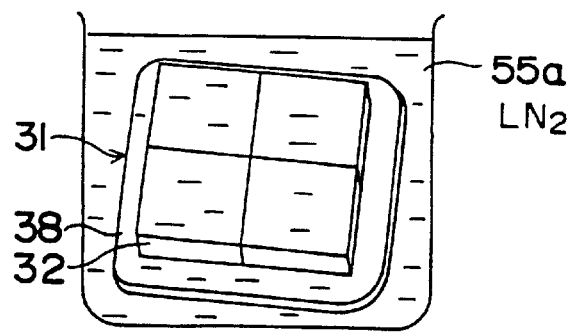

Further, FIG. 10D shows-an example wherein the multi-chip module 31 as a whole is immersed in a bath 55a of liquid nitrogen. As a result of cooling by the liquid nitrogen bath, it is possible to maximize the operational speed of the chip units 32 on the chip mother board 38 by minimizing the size of the multi-chip module 31 and hence by maximizing the integration density in the chip units 32.

Next, embodiments that use different chip mother boards will be described.

Figure 11A:
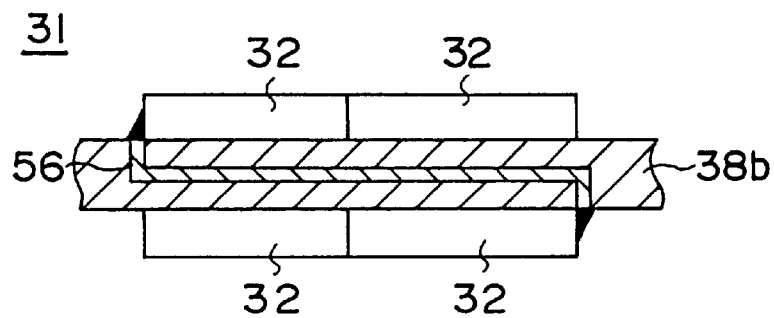
FIGS. 11A–11C are diagrams showing the multi-chip module of the first embodiment that-uses various chip mother boards.

Referring to FIG. 11A, the multi-chip module 31 is constructed upon a chip mother board 38b of a layered structure, wherein the chip mother board 38b carries thereon the chip units 32 on both the upper and lower major surfaces thereof. In the construction of FIG. 11A, the electrical interconnection between the chip units 32 is achieved by a wiring pattern 56 that is formed integrally with the layered chip mother board 38b. It will be noted, in FIG. 11A, that the wiring pattern 56 establishes a contact with the terminals at the side edges of the chip units 32, wherein the wiring pattern 56 forms a part of the layered structure of the chip mother board 38b. By providing the chip units 32 on both the upper and lower major surfaces of the chip mother board 38b, it is possible to increase the number of the chip units on the chip mother board without inviting increase in the area of the chip mother board.

Figure 11B:
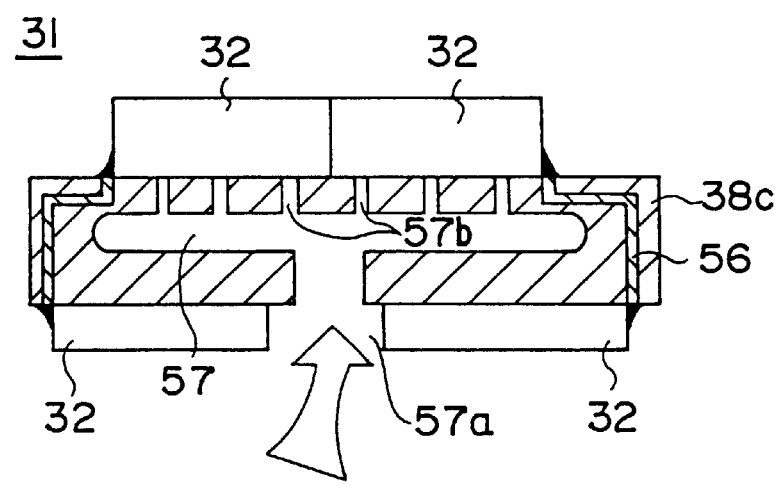

FIG. 11B shows a construction of the multi-chip module 31 that uses a hollow chip mother board 38c. Referring to FIG. 11B, it will be noted that the chip mother board 38c includes a wiring pattern as indicated by the pattern 56, wherein the wiring pattern 56 is formed integrally with the layered structure of the chip mother board 38c, similarly to the construction of FIG. 11A. It should be noted further that the chip mother board 38c of FIG. 11B includes a hollow space 57 communicating with the exterior via an opening 57a, wherein there are formed a number of openings 57b in the interior of the hollow space 57 so as to expose the lower major surface of the chip units 32. The openings 57b thus formed act as a vent that allows the cooling air introduced into the hollow space 57 via the passage 57a to contact with the exposed lower major surface of the chip units 32.

Thereby, the chip units 32 are cooled from the rear side of the chip mother board 38c. In the construction of FIG. 11B, it should be noted that one can employ the cooling construction described already with reference to FIG. 10A or FIG. 10B. Further, it is not necessary to provide the chip units 32 on both sides of the chip mother board 38c. One may provide the chip units 32 on only one side of the chip mother board 38c.

Figure 11C:
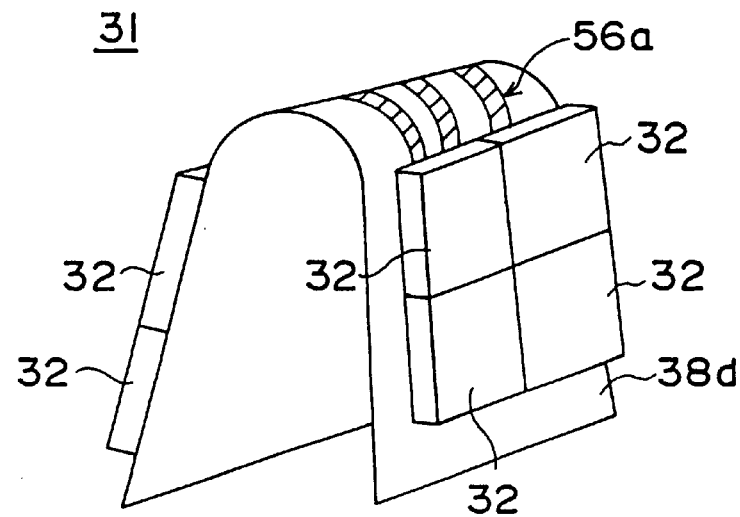

FIG. 11C shows an example of the multi-chip module that uses a flexible film 38d as the chip mother board. Referring to FIG. 11C, the flexible film 38d carries thereon a conductor pattern 56a, and the conductor pattern 56a achieves an interconnection between a first block of the chip units 32 and a second block of the chip units 32, each of the first and second blocks including a plurality to chip units 32. Typically, the chip mother board 38d is formed of a polyimide film or a polyester film, and the conductor pattern 56a is formed of a copper foil provided on the foregoing plastic film. The construction of FIG. 11C allows free bending of the chip mother board and can used in a limited space.

FIG. 12A shows an example of the multi-chip module 31 similar to the construction of FIG. 7B, except that two holes 58 are formed in respective corners of the chip mother board 38 that is not occupied by the chip units 32. By providing such holes 58, it is possible to discriminate the orientation of the module 31. Thereby, a proper positioning or alignment of the chip units 32 becomes possible when carrying the multi-chip module 31 or mounting the same upon a printed circuit board.

FIG. 12B shows another example of providing a positioning part on the multi-chip module 31. In the example of FIG. 12B, a rod 59 is provided on the rear side of the chip mother board 38 for the purpose of positioning.

FIG. 12C shows an example of the multi-chip module 31 in which a number of openings 60 are formed on the chip mother board 38 in correspondence to the chip units 32. In the example of FIG. 12C, the chip unit 32 is easily dismounted by pressing the chip unit 32 via the opening 60 while holding the multi-chip module 31 at an elevated temperature such that the solder alloy used for mounting the chip units 32 upon the chip mother board 38 causes a reflow. In the example of FIG. 12C, it is possible to replace the chip units 32 easily and the design change or replacement of defective chip units can be achieved at low cost.

Next, the process for fabricating the chip units 32 will be described with reference to FIGS. 13A–13D.

Figure 13A:
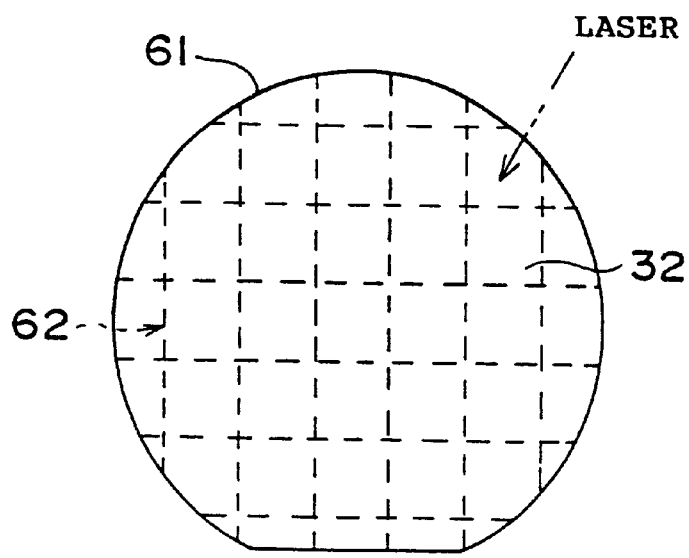
FIGS. 13A–13D are diagrams showing the fabrication process of the multi-chip module of the first embodiment.
Figure 13B:
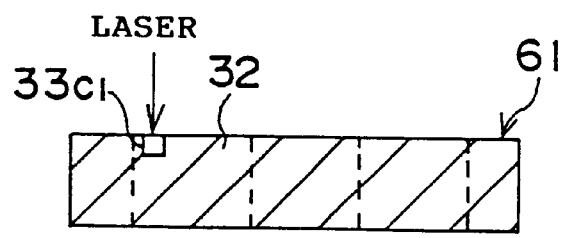

In the step of FIG. 13A, a wafer 61 on which desired device patterns such as the device patterns of a memory circuit are formed, is prepared according to the usual wafer process, followed by a scribing process conducted along scribe lines 62 that separates individual device patterns on the wafer 61. The scribing may be conducted by suitable mechanical means such as a dicing saw. When there is a need for mending the device patterns, the wafer 61 is subjected to exposure to a laser beam, before the scribing process, as indicated in FIG. 13A by a two-dotted arrow, such that the defective pattern is eliminated as a result of irradiation of the laser beam. As a result of irradiation of the laser beam, there is formed a depression $33c_1$ as represented in FIG. 13B. Further, a conductive pattern is provided in correspondence to the depression $33c_1$ by filling the depression by conductive member $33c_2$ such as a silver paste or solder alloy as indicated in FIG. 13C.

Figure 13C:
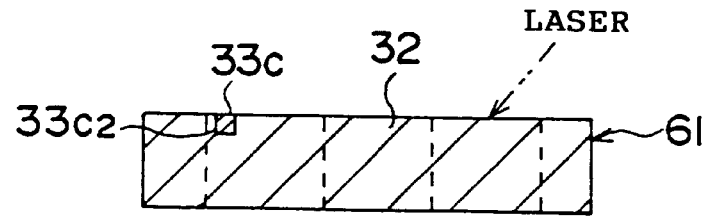

Such a mending process may be repeated as necessary by irradiation the wafer 61 again by a laser beam as indicated in FIG. 13C.

Figure 13D:
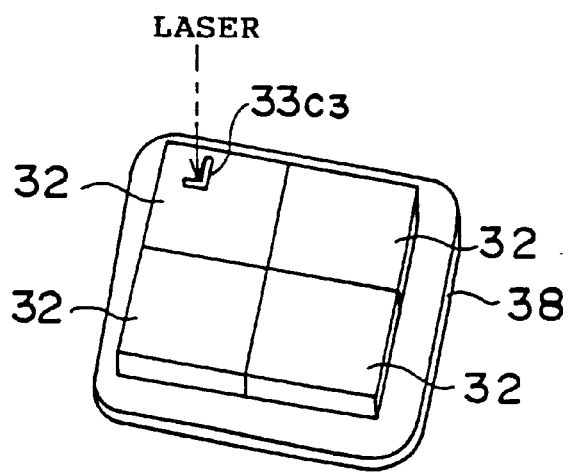

After the defects or bugs of the pattern are corrected, the wafer 61 is diced along the scribe lines to form individual chip units 32. The chip units 32 thus obtained are then placed upon the chip mother board 38 as indicated in FIG. 13D, such that adjacent chip units 32 abut with each other at the respective lateral edges. Thus, in the example of the multi-chip module of FIG. 13D, each of the chip units 32 is formed of a bare chip. In the step of FIG. 13D, it is also possible to carry out the mending of a defective circuit pattern or terminal by means of the laser beam as indicated by a reference numeral $33c_3$.

The mending process of FIGS. 13A–13D are useful not only for mending but also for forming the terminals 33 at the side edge of the chip unit 32. In such a case, depression $33c_1$ of FIG. 13B is formed on the scribe lines 62 such that the conductive member $33c_3$ filling depression $33c_1$ is exposed at the side edge of the chip unit 32 upon the scribing of the wafer 61 into individual chip units 32.

It should be noted that one can conduct an operational test of the chip units 32 at any stage of the fabrication process. For example, it is possible to carry out the test with respect to the wafer 61 in the state that the scribing of the wafer 61 into individual chip units 32 is achieved. Alternatively, it is possible to conduct the operational test upon individual chip units 32 after they are separated from the wafer 61.

Figure 14:
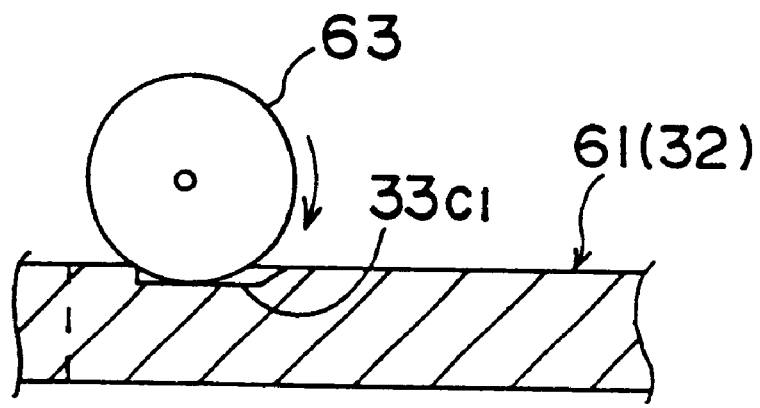
FIG. 14 is a diagram showing a modification of the fabrication process of the multi-chip module of the first embodiment.

FIG. 14 shows an alternative process of forming the depression $33c_1$ on the surface of the wafer 61. In the example of FIG. 14, the upper major surface of the wafer 61 is subjected to grinding by means of a rotating dicing blade 63. By filling the depression $33c_1$ thus formed by the conductive member $33c_2$, it is possible to provide the terminal pads on any of the upper major surface and the side edge of the chip units 32 as desired.

Figure 15:
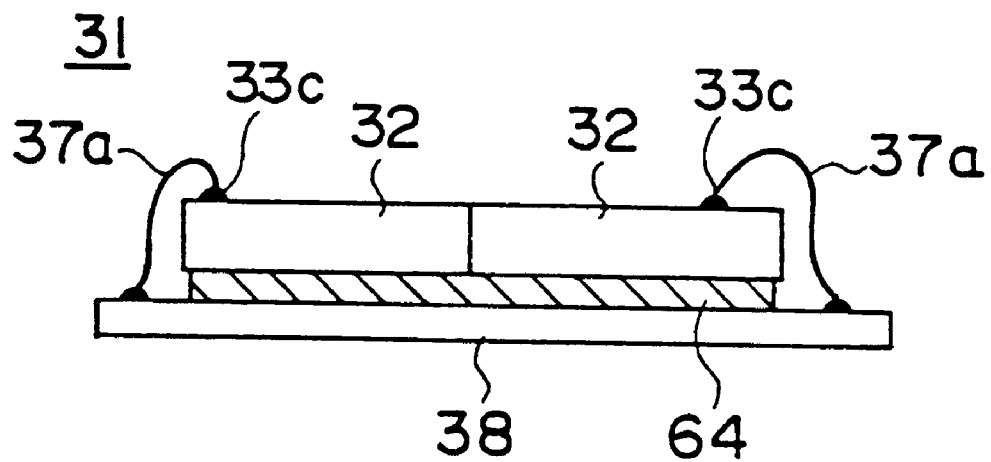
FIG. 15 is a diagram showing a further modification of the multi-chip module of the first embodiment.

FIG. 15 shows the assembling of the chip units 32 each carrying the terminal pads 33c on the upper major surface for external connection, on the chip mother board 38 to form the multi-chip module 31. It should be noted that the chip units 32 are interconnected with each other by the terminals 33 on the side edges that abut with each other as the chip units 32 are held on the chip mother board 38 such that the side edges thereof are abutted with each other. In the example of the multi-chip module of FIG. 15, it should be noted that the chips 32 are held on the chip mother board 38 with an intervening shock absorbing layer 64. Typically, a flexible resin such as urethane rubber or a metal leaf spring is used for the layer 64. The interconnection between the chip mother board 38 and the chip units 32 is achieved by the bonding wires 37a that connects the terminal pads 33c formed on the chip units 32. By forming the terminal pads 33c according to the process of FIGS. 13A–13D or FIG. 14 according to the needs that may change device by device, it is possible to form only the terminals 33 that are necessary for device connection. Thereby, the risk pertinent to the conventional multi-chip module that carries unnecessary terminals on the chip units 32 for general use of the chip unit, that moisture may penetrate into the chip unit 32 via the terminals is substantially reduced. Thereby, the reliability as well as yield of the device is improved substantially.

Figure 16A:
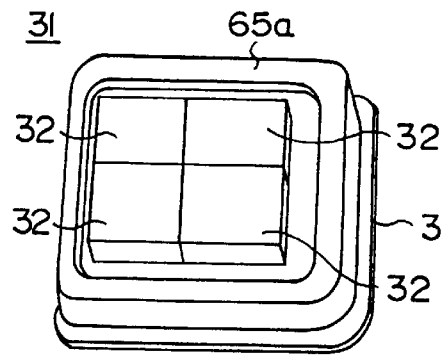
FIGS. 16A and 16B are diagrams showing a further modification of the multi-chip module of the first embodiment.
Figure 16B:
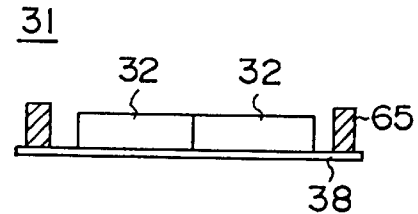

FIGS. 16A and 16B show the examples of the multi-chip module 31 that has a protective member, wherein FIG. 16A shows the module 31 in a perspective view while FIG. 16B shows the module 31 in a cross sectional view.

Referring to FIGS. 16A and 16B, the multi-chip module 31 includes a protective member 65a that surrounds the chip units 32 hold on the chip mother board 38, wherein the chip mother board 38 carries a predetermine number of the chip units 32 thereon similarly as before. The protective member 65a is typically formed of a metal or resin and protects the chip units 32 from external shocks.

Figure 17A:
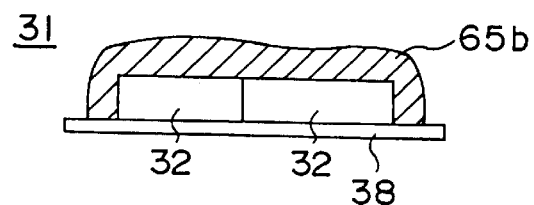
FIGS. 17A–17D are diagrams showing further various modifications of the multi-chip module of the first embodiment.

FIGS. 17A–17D show other examples of the multi-chip module 31 that carries a protective member, wherein FIG. 17A shows an example in which a protective member 65b formed of a resin is coated upon the chip units 32 held on the chip mother board 38.

Figure 17B:
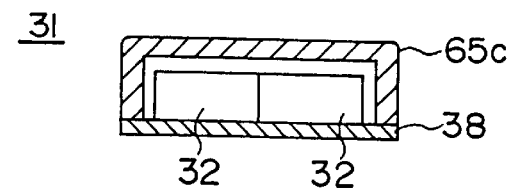

FIG. 17B, on the other hand, shows an example in which the chip units 32 are disposed on the chip mother board 38 such that the chip units 32 are accommodated in a space formed inside a resin or metal protective member 65c.

Figure 17C:
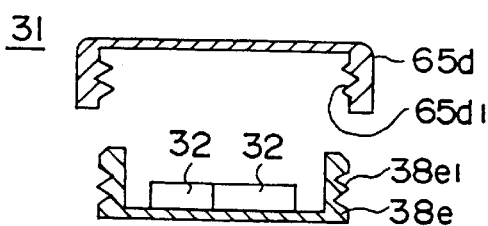

In the example of FIG. 17C, on the other hand, the multi-chip module 31 uses a chip mother board 38e having a depression at a central part thereof, wherein the chip units 32 forming the multi-chip module 31 are accommodated in the central depression on the chip mother board 38e. Thereby, the central depression is surrounded laterally by a side wall, and the side wall carries a screw thread $38e_1$ on an outer surface thereof. Further, there is provided a cap member 65d of resin or metal that has a side wall on which a thread $65d_1$ that mates the thread $38e_1$ is formed. Thus, by screwing the cap member 65d upon the chip mother board 38e, the chip units 32 are accommodated in a space formed between the chip mother board 38e and the cap member 65d. Such a construction has an advantage that it allows easy dismounting of the multi-chip module 31.

Figure 17D:
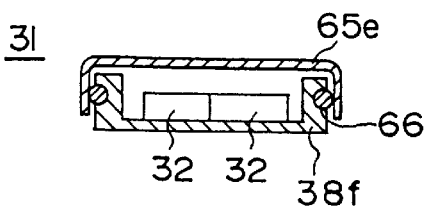

FIG. 17D shows another example of the multi-chip module 31 that uses a chip mother board 38f, wherein the chip mother board 38f includes a depression for holding the chip units 32. In the depression, the chip units 32 are surrounded laterally by a side wall of the chip mother board 38f, and a cap member 65e of resin or metal is placed upon the chip mother board 38 such that the cap member 65e and the chip mother board 38f form together a space in which the chip units 32 are accommodated, wherein the side wall of the chip mother board 38f carries on the outer surface thereof a seal ring 66 that seals the gap between the outer surface of the side wall of the chip mother board 38f and the corresponding inner surface of the cap member 65e. Thereby, the interior of the space in which the chip units 32 are accommodated, is held in an air-tight state.

Figure 18:
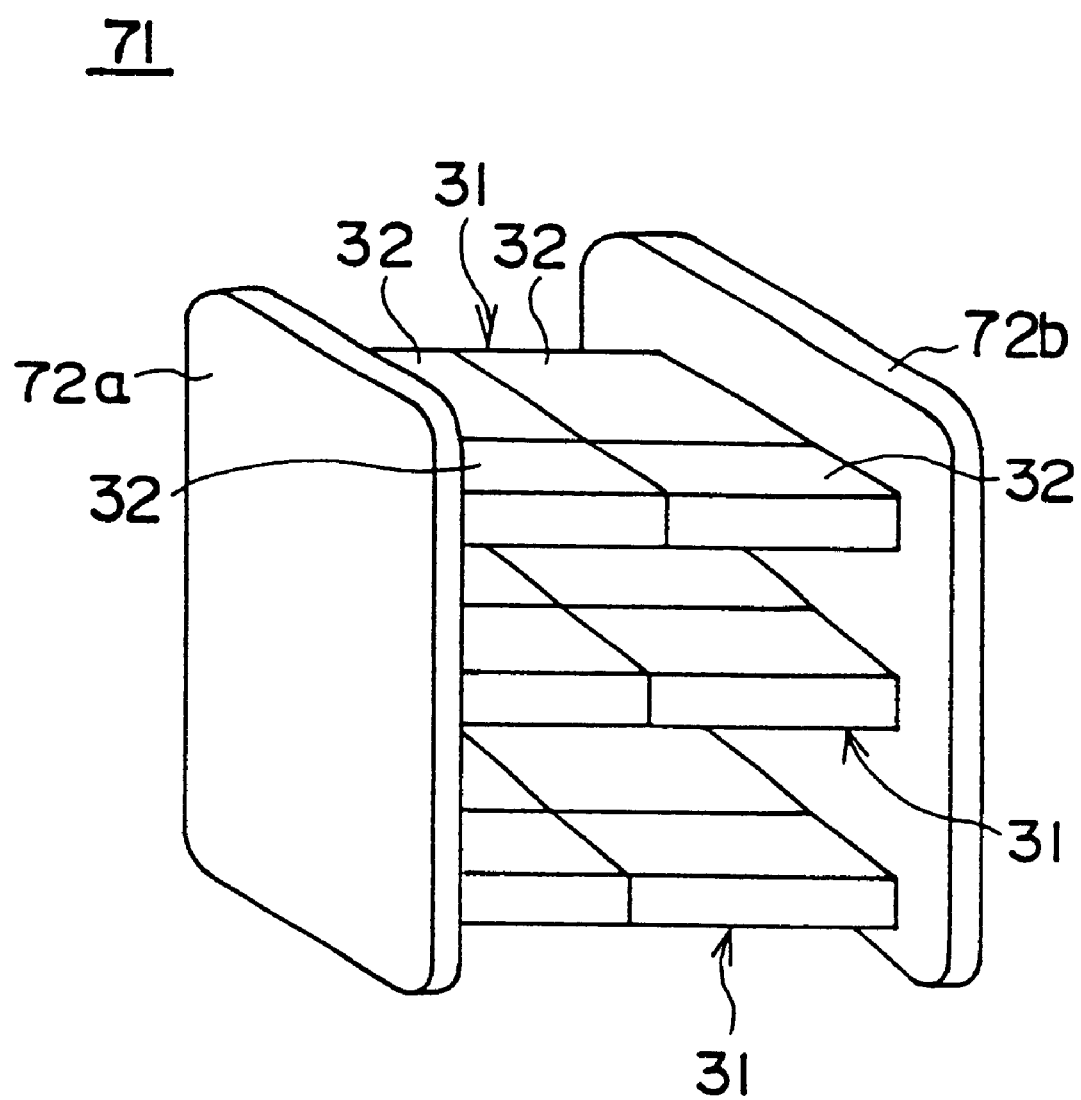
FIG. 18 is a diagram showing the construction of a semiconductor device according to a second embodiment of the present invention.

FIG. 18 shows a semiconductor device 71 according to a second embodiment of the present invention.

Referring to FIG. 18, the semiconductor device 71 includes a plurality of multi-chip modules each having a construction of the multi-chip module 31, wherein the multi-chip modules are held parallel with each other between a pair of mother boards 72a and 72b. Thereby, the mother boards 72a and 72b provides an electrical interconnection between different multi-chip modules. Alternatively, it is possible to stack a number of multi-chip modules 31 on a single mother board 72a such that the multi-chip modules 31 are connected at respective side edges and form a generally flat structure.

As already described, each of the multi-chip modules 31 includes the chip units 32 that are interconnected with each other by the terminals at the respective side edges. Such a construction is useful in reducing the overall size of the semiconductor device. Further, replacement of the chip units 32 is achieved easily in such a construction whenever there is a need for the replacement of a chip unit 32.

Further, the present invention is not limited to the embodiments described heretofore, but various variations and modifications may be made without departing from the scope of the invention.

What is claimed is:

1. A method for fabricating a semiconductor device, said semiconductor device including a plurality of chip units each including a semi conductor chip and a base member carrying thereon said plurality of chip units, comprising the steps of:

disposing said plurality of chip units on said base member such that the chip units that are disposed adjacent each other abut with each other at respective side edges in a flush manner with no spaces between said chip units, thereby establishing interconnection of terminals provided on a chip unit with corresponding terminals provided on an adjacent chip unit, said plurality of chip units forming thereby a multi-chip assembly; and providing an interconnection with a terminal on said multi-chip assembly and a corresponding interconnection pad provided on said base member.

2. A method as claimed in claim 1, wherein said step of providing an interconnection includes a step of causing a fusion in said terminal on said multi-chip assembly upon said interconnection pad, said step of fusion thereby providing a mechanical connection of said multi-chip assembly upon said base member.

3. A method for fabricating a semiconductor device, said semiconductor device including a plurality of chip units each including a semiconductor chip and a base member carrying thereon said plurality of chip units, comprising the steps of:

disposing said plurality of chip units on said base member such that the chip units that are disposed adjacent each other abut with each other at respective side edges in a flush manner, thereby establishing interconnection of terminals provided on a chip unit with corresponding terminals provided on an adjacent chip unit, said plurality of chip units forming thereby a multi-chip assembly; and providing an interconnection with a terminal on said multi-chip assembly and a corresponding interconnection pad provided on said base member, wherein said step of providing an interconnection includes a step of causing a fusion in said terminal on said multi-chip assembly upon said interconnection pad, said step of fusion thereby providing a mechanical connection of said multi-chip assembly upon said base member, and wherein said interconnection pad on said base member includes a conductive sleeve provided in a through hole formed on said base member, and wherein said step of causing the fusion in said terminal includes a step of fusing said terminal of said multi-chip assembly by means of a laser beam irradiated thereupon through said conductive sleeve.

4. A method for fabricating a semiconductor device, comprising the steps of:

forming depressions on a wafer in which a plurality of integrated circuit patterns are formed, such that each of said depressions is formed in correspondence to a terminal region of an integrated circuit pattern;

filling said depressions by a conductive member to form terminals;

scribing said wafer into a plurality of chip units each carrying an integrated circuit pattern; and assembling the plurality of said chip units adjacent each other such that each chip unit has a side edge engaging with a corresponding side edge of an adjacent chip unit, to form a multi-chip module.

5. A method as claimed in claim 4, wherein said step of assembling includes a step of disposing said plurality of chip units upon a base member.

6. A method as claimed in claim 4, wherein said step of forming depressions includes a step of grooving a surface of said wafer by using one of a laser beam and a grinding blade.

7. A method as claimed in claim 5, further comprising a step of mending one or both of said integrated circuit patterns and said terminals on said chip units by means of either of a laser beam and a grinding blade, at one of the stages of: before forming said depressions; forming said depressions; after arranging said chip units; and after mounting said chip units upon said base member.

* * * * *